(12) United States Patent
Andry et al.

(10) Patent No.: US 8,187,923 B2
(45) Date of Patent: May 29, 2012

(54) LASER RELEASE PROCESS FOR VERY THIN SI-CARRIER BUILD

(75) Inventors: Paul Stephen Andry, Yorktown Heights, NY (US); Leena Paivikki Buchwalter, Hopewell Junction, NY (US); Matthew J. Farinelli, Riverdale, NY (US); Sherif A. Goma, White Plains, NY (US); Raymond R. Horton, Dover Plains, NY (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 12/167,745

(22) Filed: Jul. 3, 2008

(65) Prior Publication Data
US 2009/0032920 A1 Feb. 5, 2009

Related U.S. Application Data

(63) Continuation of application No. 11/341,458, filed on Jan. 30, 2006, now abandoned.

(51) Int. Cl.
*H01L 21/44* (2006.01)
*H01L 21/48* (2006.01)
*H01L 21/50* (2006.01)

(52) U.S. Cl. .............. 438/118; 257/E21.237; 414/939
(58) Field of Classification Search ............ 438/118; 257/E21.237; 414/939
See application file for complete search history.

(56) References Cited

U.S. PATENT DOCUMENTS

| 4,432,848 | A | * | 2/1984 | Korpman | 524/533 |
| 5,242,755 | A | * | 9/1993 | Keller et al. | 428/457 |
| 5,851,845 | A | | 12/1998 | Wood et al. | |
| 6,307,008 | B1 | * | 10/2001 | Lee et al. | 528/353 |
| 6,732,610 | B2 | | 5/2004 | Higuchi et al. | |
| 6,762,074 | B1 | | 7/2004 | Draney et al. | |

FOREIGN PATENT DOCUMENTS

JP 11-320684 * 11/1999

OTHER PUBLICATIONS

Shimoda, T., et al., "Surface Free Technology by Laser Annealing (SUFTLA)", IEDM, 1999, p. 289-292.*
Stoffel, N. C., et al., "Adhesion Enhancement and Lamination of Polyimide Films", May 1996, IEEE Trans. CPMT, Part B: Adv. Pack., vol. 19, No. 2, p. 417-422.

* cited by examiner

*Primary Examiner* — Howard Weiss
(74) *Attorney, Agent, or Firm* — Connolly Bove Lodge & Hutz LLP; Daniel P. Morris, Esq.

(57) ABSTRACT

A laser release and glass chip removal process for a integrated circuit module avoiding carrier edge cracking is provided.

10 Claims, 6 Drawing Sheets

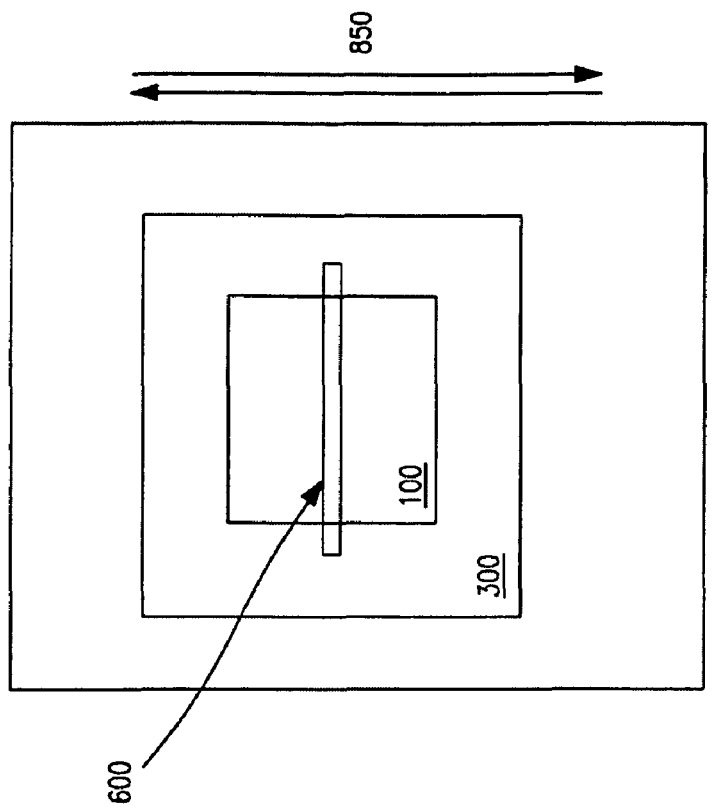
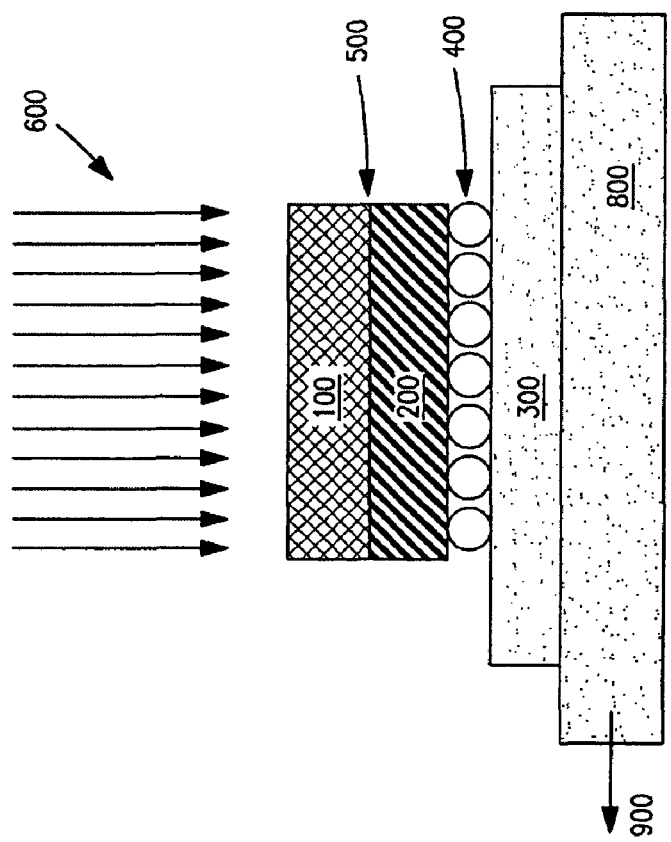
FIG. 2B
FIG. 2A

LASER RELEASE PROCESS FOR VERY THIN SI-CARRIER BUILD

This application is a Continuation Application of U.S. Pat. No. 11/341,458, filed Jan. 30, 2006, now abandoned, the entire disclosure of which is herein incorporated by reference in its entirety.

This invention was made with Government support under Contract NBCH3039003, awarded by the Defense Advanced Research Projects Agency and Contract H98230-04-C-0920 awarded by the National Security Agency. The Government has certain rights in this invention.

DESCRIPTION

Technical Field

The present disclosure relates generally to integrated circuits, and particularly, but not by way of limitation, to a semiconductor or glass substrate-based carrier for mounting and packaging multiple integrated circuit chips and/or other devices. The carrier is a chip or wafer with glass handler wafer, insulated, conductive through-vias exposed on top and underside, to connect flip-chip and other device I/O through the carrier to next-level package, board, or other flip-chips mounted on the bottom side.

The present disclosure also relates attaching ultra-thin (about 150 µm down to BEOL+FEOL thickness) chips with no through silicon vias to a substrate.

This disclosure is directed to release of a glass handler wafer from, for instance, a singulated C4-joined carrier or chip on a substrate.

BACKGROUND

Fabricating a semiconductor carrier for an integrated circuit module is currently achieved by one of two fundamentally different options. One technique involves creating the semiconductor (e.g.—Si)-through via first (=via first (VF)) and the other creates the semiconductor-through via last (=via last (VL)). The VF approach is built using a full thickness wafer until nearly the end of the process. The VL process builds the BEOL first, thins the wafer to thickness of about 50-150 µm followed by the through wafer via definition. The VL application requires that the wafer be laminated onto a glass handler wafer after the BEOL build completion and before wafer thinning and through via RIE. The thinned wafer with the laminated glass handler wafer is diced after the through via fill, BLM, and C4 depositions. It is for these singulated thin Si-carriers that the process of glass carrier wafer removal is designed. This removal process takes place after the Si-carrier with the laminated glass is C4 joined to a substrate.

Difficulties are encountered in the removal process for VL and VF fabrication because the thinned wafer renders the carrier vulnerable to cracking, especially at the edges. This vulnerability is exacerbated by the stress placed on the carrier by the C4 balls used in the joining to the substrate.

A method to fabricate thinned Si-chips with C4 balls is to use the 3M Wafer Support System for ultra thin wafer back-grinding. In this approach a wafer is adhered onto a glass handler wafer, which is larger than the Si-wafer, using UV curable liquid adhesive with thermal stability of about 200° C. The Si-wafer (without through vias) is thinned and mounted onto the dicing tape on a frame. The adhesive—glass wafer interface is ablated using laser radiation followed by whole glass wafer removal off the adhesive backed thinned Si-wafer. The residual UV resin film is peeled off the thinned, bumped Si-wafer which is left on the framed dicing tape for chip singulation. After singulation the chips are joined to a substrate as is well known in the art. Chip pick and place operation will set limits to the thickness of the thinned Si-chip, which is likely to about 150 µm-200 µm to avoid chip fracture during handling and chip joining.

This type of method is used without the C4-balls to join thinned full wafers to each other in the 3D-packaging approach.

In these approaches the glass wafer is larger than the Si-wafer itself. This makes it impossible to do further CMOS BEOL processing on the Si-wafer post lamination to the glass handler wafer, as most of the standard CMOS tooling cannot handle the larger size.

It should also be noted that in the advanced applications, such as the Si-carrier application, the carrier dimensions can be several centimeters per side (i.e. significantly larger than a standard Si-chip). The size combined with the Si-thickness down to the BEOL thickness will make it impossible to pick these carriers off the dicing tape and flip-chip join them without damage to the carrier. Thus the existing methods are not applicable for the processing or flip-chip joining of the large, thin Si-carriers.

SUMMARY

The present disclosure addresses problems as discussed above that are encountered in the prior fabrication techniques. For instance, this disclosure facilitates the joining of ultra-thin Si-chips to a substrate without handling damage.

The present disclosure relates to an article comprising a semi-conductor carrier or chip wafer, comprising:
a semiconductor substrate having CMOS BEOL wiring defined thereon;
a layer of a synthetic resin release adhesive applied and cured on the substrate, or on a glass handler wafer, or both; wherein the adhesive upon curing can withstand temperatures of at least 400° C.; and
a glass handler wafer laminated to the semiconductor substrate with the adhesive located between the semiconductor substrate and glass handler wafer.

The present disclosure also relates to a process of fabricating an integrated circuit module supported on a glass handler wafer;
obtaining a semiconductor substrate having CMOS BEOL; wiring defined thereon;
obtaining a glass handler wafer;
applying a layer of a synthetic resin release adhesive on the substrate or on a glass handler wafer or both; and curing the adhesive, wherein the adhesive upon curing can withstand temperatures of at least 400° C.;
laminating the glass handler wafer to the semiconductor substrate with the adhesive located between the semiconductor substrate and glass handler wafer;
thinning the semiconductor-carrier wafer to the thickness of the CMOS BEOL; wiring or greater than the thickness of the CMOS BEOL wiring but less than about 150 µm;
carrying out processing on the backside of the semiconductor-carrier wafer after the thinning;
depositing C4 balls on the semiconductor-carrier wafer;
then dicing the carrier wafer with the glass-handler wafer to a pre-determined carrier size; and
joining the diced semiconductor carrier-laminated glass handler wafer to a substrate using the C4 balls.

Other objects, features, and advantages of the present disclosure will become apparent from the following detailed description. It should be understood; however, that the detailed description and specific examples, while indicating preferred aspects of the present invention, are given by way of illustration only and various modifications may naturally be performed without deviating from the present disclosure.

BRIEF DESCRIPTION OF DRAWINGS

FIG. 2A illustrates the structure of FIG. 1 mounted on a vacuum plate.

FIG. 2B is a top down view of FIG. 2A.

Figure 1:
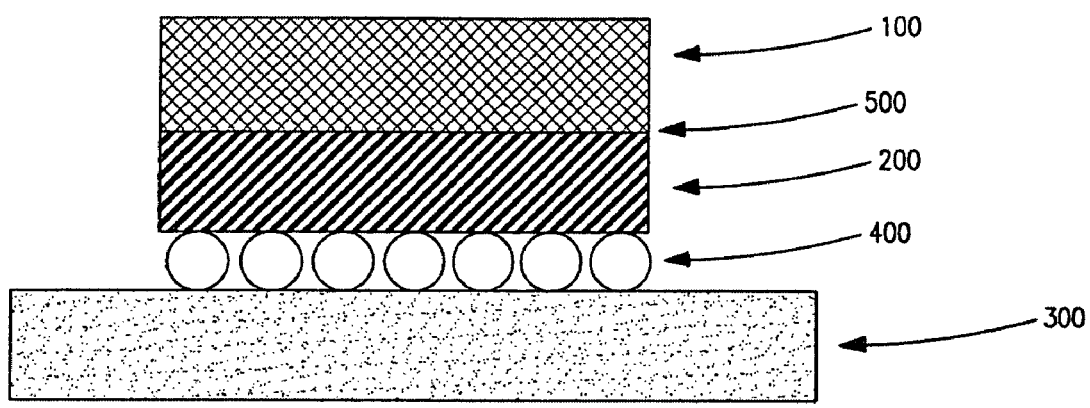
FIG. 1 is a schematic figure of an integrated circuit module according to the present disclosure.

It is to be noted, however, that the appended drawings illustrate only typical embodiments of this disclosure and are therefore not to be considered limiting of its scope, for the disclosure may admit to other equally effective embodiments.

DETAILED DESCRIPTION OF BEST AND VARIOUS EMBODIMENTS

Reference is made to the figures to illustrated selected embodiments and preferred modes of carrying out the disclosure. It is to be understood that the disclosure is not hereby limited to those aspects depicted in the figures. It is emphasized that, according to common practice, the various features of the drawing are not to scale. On the contrary, the dimensions of the various features are arbitrarily expanded or reduced for clarity. Included in the drawing are the following figures.

FIG. 1 shows a schematic of a thinned (few μm to about 150 μm) semiconductor bonded to glass handler wafer (100) using high temperature adhesive (500). The layer of synthetic resin release adhesive (500) is applied and cured on the substrate (300) and/or on the glass handler wafer (100). The adhesive upon curing typically can withstand temperatures of at least 400° C. When, the adhesive is coated on either the substrate or the glass handler wafer, another high temperature stable polymer, such as a different polyimide that would not necessarily have the optimized flow characteristics, can optionally be coated on the other wafer. The structure is joined to substrate (300) using C4 balls (400).

The semiconductor is typically silicon but can be another semiconductor such as silicon carbide, gallium arsenide and the like. The high temperature adhesive (500) upon being cured desirably can withstand temperatures of at least 400° C. Typically the adhesive layer has a thickness of <10 μm and more typically at least about 3 μm to about 5 μm.

Typically the adhesive layer is a polyimide and a flow optimized polyimide to facilitate bonding.

Commercially available polyimide precursors (polyamic acid, acid-ester or ester) are various polyimide precursors from HD Microsystems (DuPont) and available under the trade designation Pyralin. These polyimide precursors come in many grades, including those available Pyralin polyimide precursors from HD Microsystems (DuPont) under the further trade designations PI-2555, PI-2545, PI-2560, PI-5878, PIH-61454, and PI-2540. Some of these are Pyromelletic Dianhydride-Oxydianiline (PMDA-ODA) polyimide precursors.

Commercially available chemically cured polyimides are various polyimides from HD Microsystems (DuPont) and available under the trade designation Kapton, including H-Hapton, V-Kapton, HN-Kapton, and VN-Kapton, which are all chemically cured polyimides. The chemically cured polyimides are generally cured with an anhydride curing agent such as acetic anhydride. Also, commercially available are Upilex polyimides from Ube Industries.

PI adhesive available from HD Microsystems under trade designation for experimental materials HD300x, where x indicates systematic number to identify different proprietary PI adhesive compositions and/or solids concentration, molecular weight, and viscosity of the solution tailored to particular application of the adhesive as determined by customer.

A particular example employed according to the present disclosure is available under the trade designation P15878 (PMDA-ODA) and HD3003-X1 of proprietary polyimide precursor solution described as PI adhesive.

The following table illustrates properties of polyimides

| Property | Unit | PI 5878 | PI adhesive | Comment |
|---|---|---|---|---|
| Glass transition temperature | C. | ~400 | ~188 | Lower $T_g$ important for good polymer flow during lamination at $T > T_g$ |
| Modulus | GPa | 2.3 | 2.7 | |
| <1% weight loss | C. | 560 | 488 | Thermal stability to 400 C. required as post laminating process temperatures can reach that temperature |
| Molecular weight | | ~20000 | <100000 | PI5878 and PI adhesive are different chemistries and thus the MW is not comparable between the two. For a good flow characteristic the adhesive MW needs to be relatively low. |

Other chemistries that have been shown to work in similar fashion as the PI adhesive above is: ODPA-ODA, which has Tg~270 C. and laminates well at 350 C. (N. Stoffel, M. Hsieh, E. J. Kramer, and W. Volksen, IEEE Trans. CPMT Part B: Adv. Pack., 19, 417-422 (1996). disclosure of which is incorporated herein by reference). If desired, an adhesion promoter can be employed to enhance the bond to the carrier. Suitable adhesion promoters include silanes such as aminopropyltriethoxysilane. The silanes also help with humidity resistance of the bond.

Fabrication process practicalities place lower limits on Si-wafer thickness without supporting structure to about 200 μm. Thinner wafers must be supported in order to be processes using CMOS fabrication facilities.

The present disclosure is directed at a further requirement where the CMOS BEOL wiring and interconnect structures are largely built prior to lamination of the glass handler wafer with the device wafer. Typically the glass wafer is CTE matched relatively closely with the Si-wafer with optimized laser transparency at the required laser wavelength.

The device wafer is thinned using processes known in the art to thickness ranging from BEOL wiring structure thickness of few micrometers to about 100 μm-about 150 μm thickness. Further CMOS BEOL processing is done on the thinned wafer as required by the device design including C4 ball deposition. The glass/adhesive/thinned Si-wafer stack is diced. The diced carrier chips are joined to the substrate using methods known in the art resulting in a structure such as that shown in FIG. 1 to provide an integrated circuit module.

The module is placed on vacuum stage (FIG. 2A) and held in place with the applied vacuum.

FIG. 2A shows the structure of FIG. 1 mounted on a vacuum plate (800) on x-y translation stage (900=vacuum port). Laser beam (600) shown larger than the glass handler wafer lateral dimension. FIG. 2B shows a top down view. X-movement of the translation stage is noted.

Figure 3:
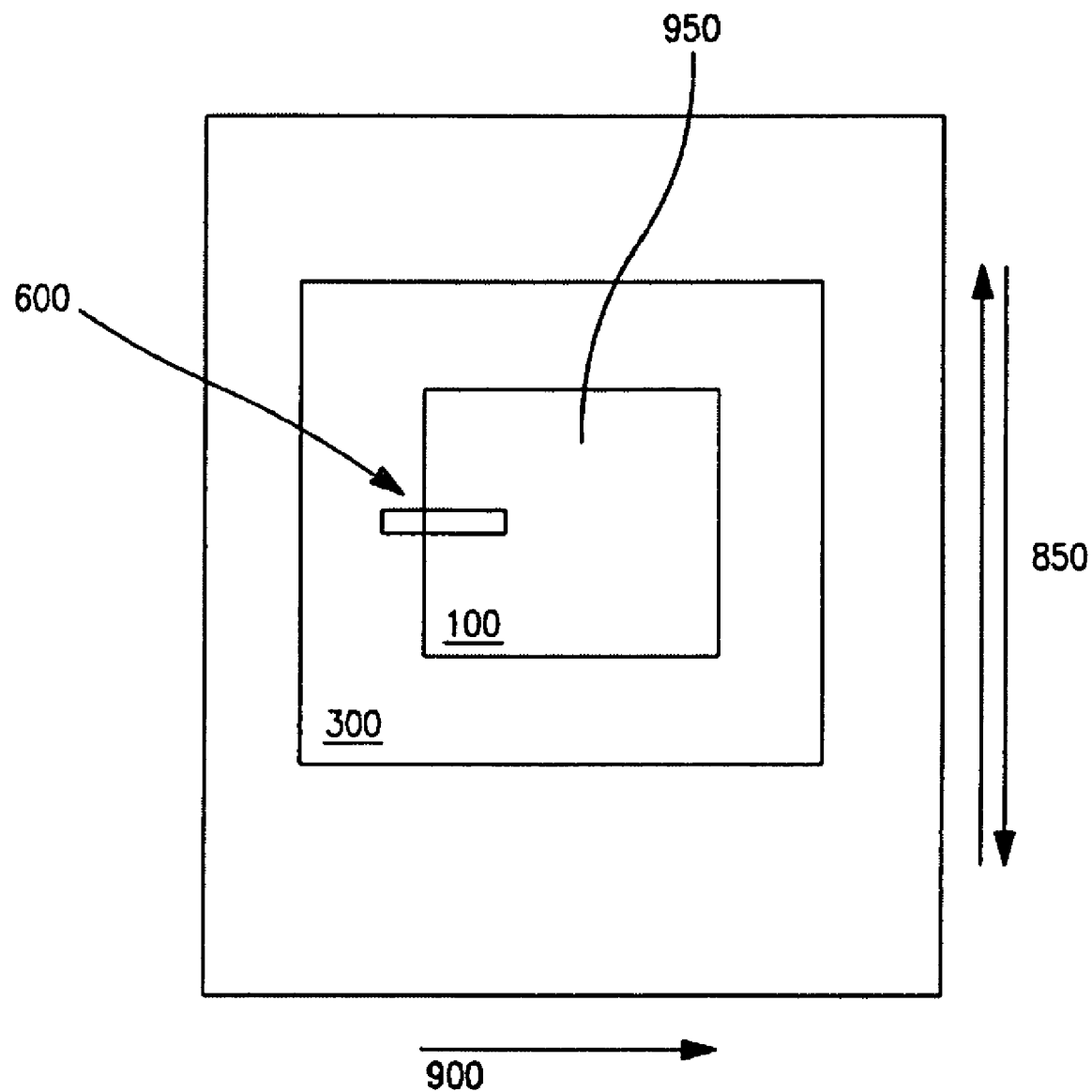
FIG. 3 is a schematic of the case where the sample to be released is larger than the laser beam.

FIG. 3 shows a schematic of case where sample (100) to be released is larger than the laser beam (600). A raster pattern (950) is used to release the whole area necessary. Y-movement of the translation stage is noted (900).

Figure 4:
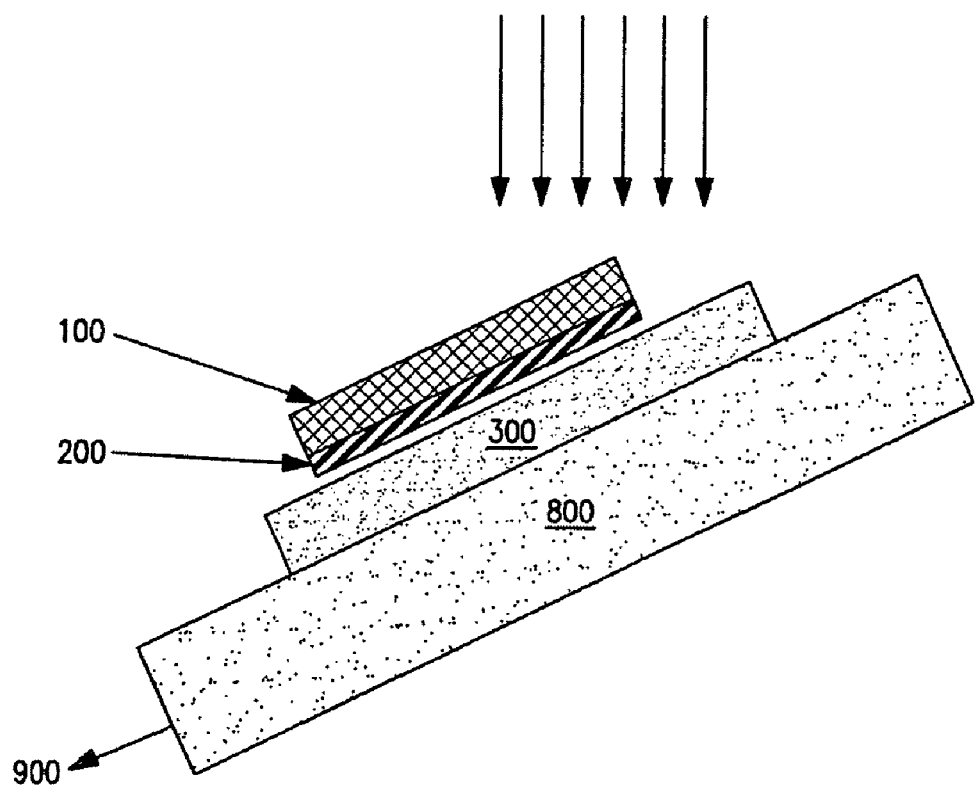
FIG. 4 shows laser release of the cut edges of a carrier and glass handler wafer.

FIG. 4 shows laser release processing of the cut edges of the Si-carrier (200) and the glass handler wafer (100). High temperature adhesive and C4s are not shown for simplicity.

The edges of the glass/adhesive/thinned Si-carrier are exposed to laser release process (FIG. 4) at an optimized angle using 308 nm excimer laser radiation with optimized pulse energy, repetition rate, and sample x-y movement speed. It is to be noted that, the aforementioned description utilizing an excimer laser operation at a wavelength of 308 nm, is only an exemplary process and that other types of lasers and laser wavelengths can be used so long as the optical energy of the laser couples with the polymer adhesive material used. After edge release the sample is exposed to laser in the manner described in FIG. 2 or FIG. 3 depending on the relative size of the sample and the laser spot size.

Table 1 below shows a set of successful process conditions, but by no means limits the processing to such. Those skilled in the art can quickly determine many different permutations between table speed, repetition rate, fluence, and processing time that will give the desired result.

TABLE 1

A set of successful laser release processing conditions.

| Step | Process conditions | Time/min |
|---|---|---|
| 1) Full wafer/carrier laser release (308 nm) | Up to ~105 mJ/cm$^2$/pulse (70 mJ/pulse over 0.67 cm$^2$), 4-11 Hz, table speed ~3 mm/min; unzip edges first | 45/5-20 |
| 2) Carbon 'ash' removal | DI water + Liquinox soap rinse + DI water rinse (batch process) | ~10 |
| 3) Plasma ash | 650 mTorr O$_2$ @ 200 W (batch process) | 150 |

Carbon ash removal process shown in the table is by no means limited to the one shown. Many different wet chemical or even dry processes can be used to remove the ash.

Removal of the residual adhesive can be achieved with many different plasma and reactive ion etch processes known in microelectronics processing and is not limited to using pure oxygen. Other gases and gas mixtures can be used.

Figure 5C:
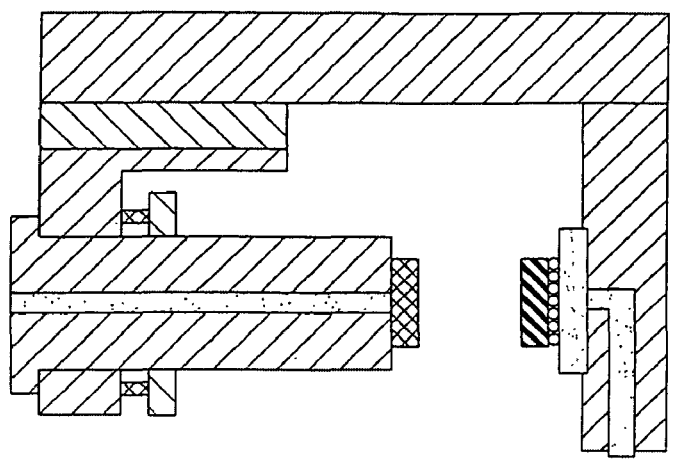
FIG. 5C shows the glass handler removed.
Figure 5B:
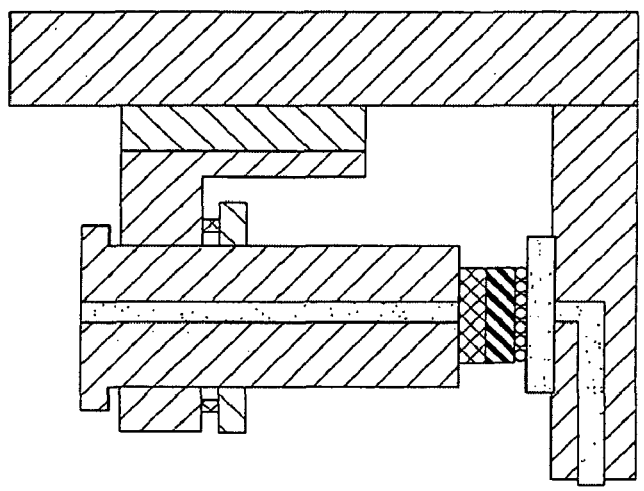
FIG. 5B shows the vacuum head in contract with the sample.
Figure 5A:
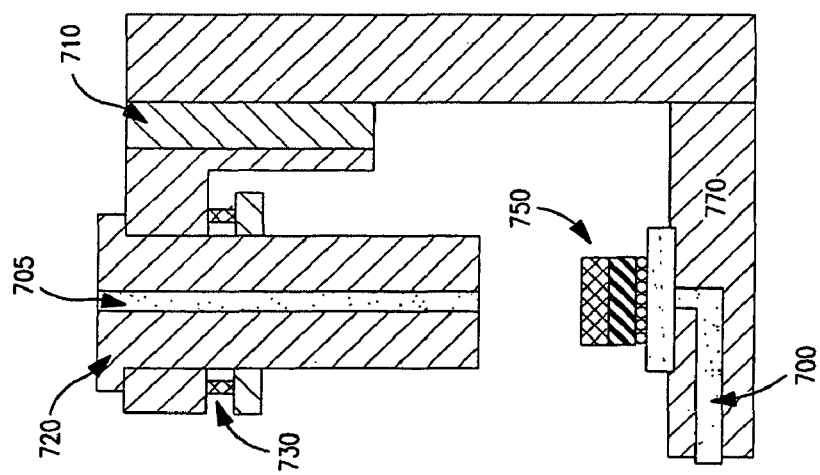
FIG. 5A shows a fixture for the laser released glass chip final removal process.
Figure 6:
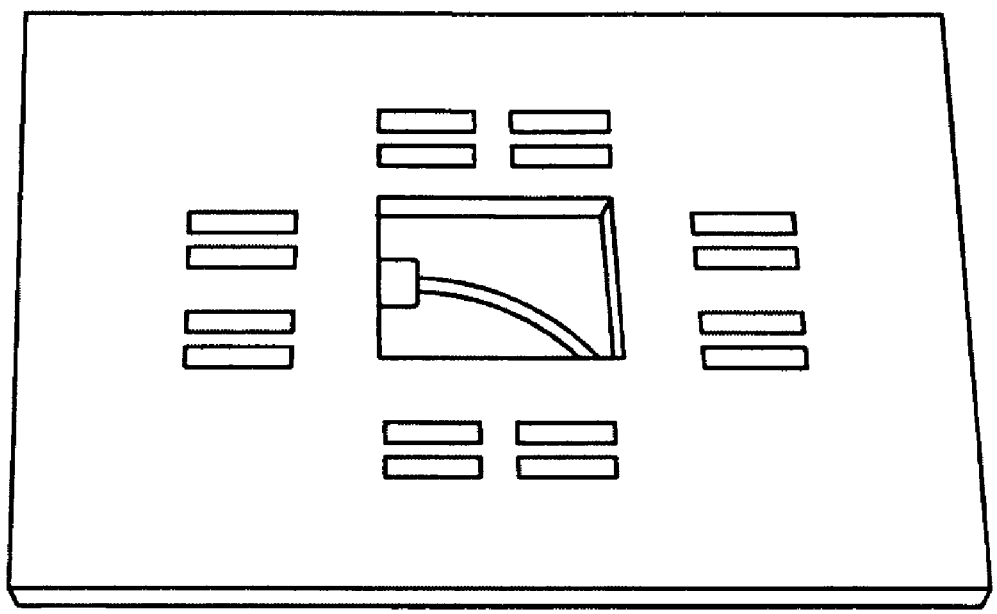
FIG. 6 shows an example of a structure from which the glass has been removed and surface has been cleaned.

After exposure to laser the module is placed on vacuum chuck to remove the glass in the manner that damage to the thin Si-carrier edges is limited (FIGS. 5A-C).

FIG. 5A shows a fixture for the laser released glass chip final removal process. Sample (750) after laser exposure is mounted on a vacuum stage (770) with access to vacuum (700). A vacuum head assembly (720) with connection to vacuum (705) and with springs (730) to control pressure applied to the sample (750) and parallelism of the vacuum head contact area with the sample (750). Z-movement with micrometer (710) is noted. FIG. 5B shows the vacuum head in contact with the sample. FIG. 5C shows the glass handler removed.

Following the glass removal the module is exposed to carbon ash removal and plasma ash clean process leaving the top surface of the Si-carrier clean and ready for chip join using C4 processing.

Multiple laser exposure passes may be needed so as to reduce the fluence and thus control the pressure wave created during adhesive ablation. Optimized conditions are important in order to avoid fracture of the thinned Si-carrier joined to a substrate with C4 balls. By way of example, the edges of the carrier are generally released first, and then the ablation/release process proceeds from one edge to the other. Other raster patterns can of course be used. This exemplary process allows for a path of escaped for gases created during the ablation process. Flexure of the thinned carrier in between the C4 balls can result in fracture if the pressure wave, as caused by the laser ablation process, is too intense.

An embodiment of the present disclosure provides an alternative path in avoiding thinned carrier fracture by applying a chip underfill material to give added support to the thinned Si-device prior to laser release processing. The underfill material can be any of the materials known in the art that will cure at temperatures below the decomposition onset of polyimide adhesives or at temperatures less than about 350° C.

Preferred underfill materials are those composed of epoxy resin and silica filler to reduce underfill CTE thus reducing any thermal expansion related problems during laser release processing.

The foregoing description illustrates and describes the disclosure. Additionally, the disclosure shows and describes only the preferred embodiments but, as mentioned above, it is to be understood that it is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known by applicant and to enable others skilled in the art to utilize the disclosure in such, or other, embodiments and with the various modifications required by the particular applications or uses thereof. Accordingly, the description is not intended to limit the invention to the form disclosed herein. Also, it is intended that the appended claims be construed to include alternative embodiments.

All publications and patent applications cited in this specification are herein incorporated by reference, and for any and all purposes as if each individual publication or patent application were specifically and individually indicated to be incorporated by reference.

Having thus described our invention, what we claim as new, and desire to secure by Letters Patent is:

1. A process of fabricating an integrated circuit module on a glass handle wafer comprising;

obtaining a semiconductor substrate having CMOS BEOL wiring defined thereon;

obtaining a glass handler wafer; applying a layer of a synthetic adhesive on the substrate or on the glass handler wafer or both, and curing the synthetic adhesive, wherein the synthetic adhesive upon curing can withstand temperatures of at least 400° C.;

laminating the glass handler wafer to the semiconductor substrate with the synthetic adhesive located between the semiconductor substrate and the glass handler wafer;

thinning the semiconductor-carrier wafer to the thickness of the CMOS BEOL wiring or greater than the thickness of the CMOS BEOL wiring but less than about 150 μ;

carrying out processing on the backside of the semiconductor-carrier wafer after the thinning;

depositing C4 balls on the semiconductor-carrier wafer;

then dicing the carrier wafer with the glass-handler wafer to a pre-determined carrier size; and joining the diced semiconductor carrier-laminated glass handler wafer to a substrate using the C4 balls;

subjecting the supported module to an excimer laser release process to degrade the release adhesive and separating the glass handler wafer from the module;

placing the module onto a vacuum chuck of a X-Y translation stage to minimize module jitter during ablation/release;

wherein the edges of the carrier/adhesive/glass handler module are exposed first on tilt stage to the laser radiation; and wherein the bulk carrier/adhesive/glass handler module is exposed to laser radiation at 0degree tilt, whereby cracking of the carrier edge is avoided.

2. The process according to claim 1, which further comprises:

wherein the tilt stage may vary in angle from 90 degrees to zero degrees normal to the optical axis of the laser beam;

where the bulk carrier/adhesive/glass handler module is exposed to the optical axis of the laser radiation at 90 degrees.

3. The process according to claim 2 which further comprises placing the carrier/adhesive/glass handler module that has been exposed to laser radiation on a vacuum stage of a glass handler removal tool; applying vacuum to hold the module in place;

manually bringing down the glass handler removal tool into contact with the module, wherein the glass handler removal tool is micrometer controlled;

applying vacuum to the glass handler chip;

pulling off the glass handler chip in a controlled manner to avoid cracking of the carrier edge.

4. The process according to claim 3 which further comprises treating the module after removing the handler glass chip with a soap-containing rinse for removing carbon ash; then rinsing with water; then drying; and then removing residual adhesive by plasma etching.

5. The process according to claim 4 wherein the drying is a $N_2$-drying process.

6. The process according to claim 4 which further comprises cleaning after the plasma etching by a super-critical $CO_2$ dry cleaning process.

7. A process of fabricating an integrated circuit module on a glass handle wafer comprising;

obtaining a semiconductor substrate having CMOS BEOL wiring defined thereon;

obtaining a glass handler wafer; applying a layer of a synthetic adhesive on the semiconductor substrate or on the glass handler wafer or both, and curing the synthetic adhesive, wherein the synthetic adhesive upon curing can withstand temperatures of at least 400° C.;

laminating the glass handler wafer to the semiconductor substrate with the synthetic adhesive located between the semiconductor substrate and glass handler wafer to form a semiconductor-carrier wafer;

thinning the semiconductor-carrier wafer to the thickness of the CMOS BEOL wiring or greater than the thickness of the CMOS BEOL wiring but less than about 150 μ;

carrying out processing on the backside of the semiconductor-carrier wafer after the thinning;

depositing C4 balls on the semiconductor-carrier wafer;

dicing the carrier wafer with the glass-handler wafer to form a glass handler chip of a pre-determined carrier size;

joining the diced semiconductor carrier-laminated glass handler wafer to a substrate using the C4 balls to form a supported module;

subjecting the supported module to an excimer laser release process to degrade the synthetic adhesive and separating the glass handler wafer from the supported module;

placing the supported module onto a vacuum chuck of a X-Y translation stage to minimize module jitter during ablation/release;

wherein the edges of the supported module are exposed first on tilt stage to the laser radiation;

wherein the supported module is exposed to laser radiation at 0 degree tilt;

placing the supported module that has been exposed to laser radiation on a vacuum stage of a glass handler removal tool;

applying vacuum to hold the supported module in place;

manually bringing down the glass handler removal vacuum head assembly into contact with the supported module, wherein the glass handler removal vacuum head assembly is micrometer controlled;

applying vacuum to the glass handler chip;

pulling off the glass handler chip in a controlled manner to avoid cracking of the carrier edges.

8. The process according to claim 7 which further comprises treating the module after removing the handler glass chip with a soap-containing rinse for removing carbon ash; then rinsing with water; then drying; and then removing residual adhesive by plasma etching.

9. The process according to claim 8 wherein the drying is a $N_2$-drying process.

10. The process according to claim 8 which further comprises cleaning after the plasma etching by a super-critical $CO_2$ dry cleaning process.

* * * * *